United States Patent [19]

Kihara et al.

[11] Patent Number: 4,988,895
[45] Date of Patent: Jan. 29, 1991

[54] COMPARATOR CIRCUIT

[75] Inventors: Seiichiro Kihara, Nara; Zenpei Tani, Tondabayashi; Hisao Nagao, Nara, all of Japan

[73] Assignee: Sharp Kabushiki Kaisha, Osaka, Japan

[21] Appl. No.: 541,211

[22] Filed: Jun. 22, 1990

Related U.S. Application Data

[63] Continuation of Ser. No. 316,985, Feb. 28, 1989, abandoned.

[30] Foreign Application Priority Data

Feb. 29, 1988 [JP] Japan .................. 63-27109

[51] Int. Cl.⁵ .................. H03K 5/153; H03K 5/24; H03K 5/08
[52] U.S. Cl. .................. 307/359; 307/315; 307/362; 307/491; 307/494
[58] Field of Search .................. 307/315, 350, 359, 362, 307/491, 494

[56] References Cited

U.S. PATENT DOCUMENTS 3,628,059 12/1971 Niu ........................... 307/359
3,879,662 4/1975 Barneck ...................... 307/362

Primary Examiner—John Zazworsky

[57] ABSTRACT

A novel comparator circuit is disclosed, in which a pulse output is obtained from the output terminal of a differential amplifier through a transistor by applying a threshold voltage to either input terminal of a differential amplifier composed of a pair of transistors and then comparing an input voltage applied to the other input terminal therewith, wherein the aforementioned pair of transistors of the differential amplifier are each composed of two transistors connected in a complex manner, the input voltage is directly inputted, without the use of a buffer or the like, by raising the input impedance of the comparator circuit to thereby simplify the circuit as a whole and to widen its scope of application. Further, the output terminal of the differential amplifier connected to a transistor in an output circuit of the comparator circuit and a power source are connected through a resistor so as to ensure against occurrence of impulses in the output pulses through prevention of operation of the output circuit alone before changing of the threshold voltage for causing a hysteresis property to be imparted to the comparator circuit.

8 Claims, 4 Drawing Sheets

Fig. 1
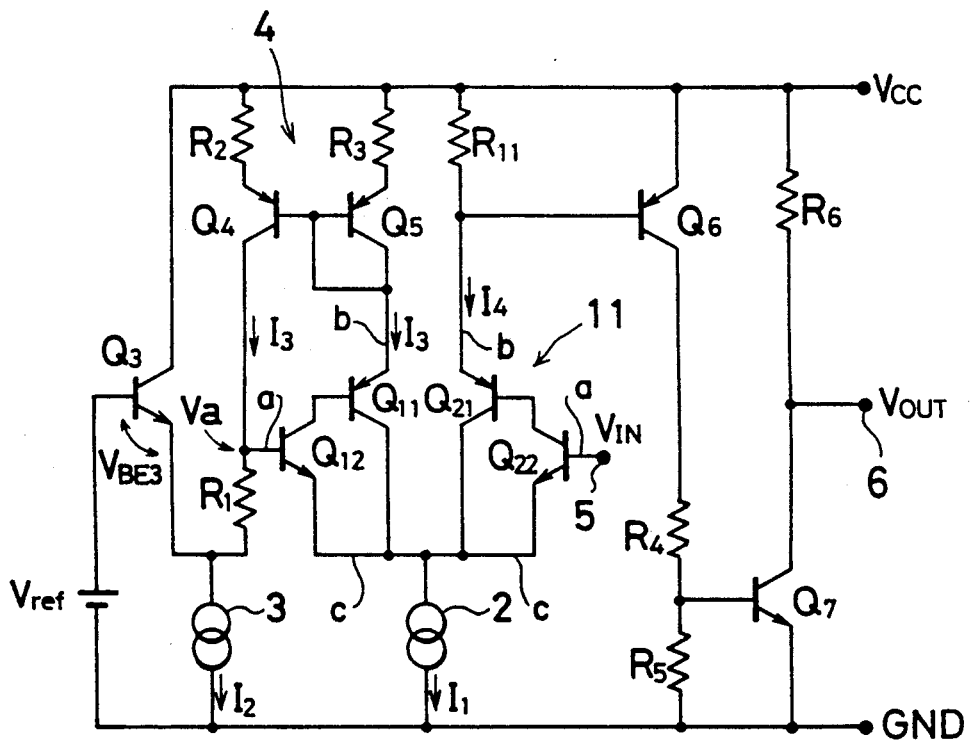
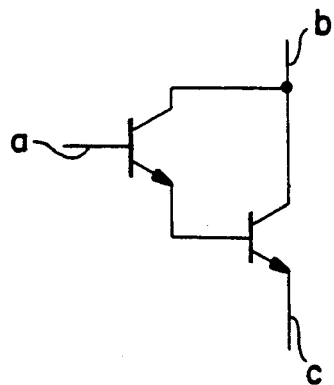
Fig. 5

COMPARATOR CIRCUIT

This application is a continuation of application Ser. No. 07/316,985 filed on Feb. 28, 1989, now abandoned.

FIELD OF THE INVENTION

The present invention relates to a comparator circuit which is applied to, for example, a photo detector of an optical remote controller and used for obtaining a pulse output through comparison of an input voltage with a threshold voltage.

BACKGROUND OF THE INVENTION

In a photo detector of an optical remote controller, a comparator circuit is used for reproducing an original pulse signal from an analog signal made by demodulating an output from a photo detector element.

An example of a conventional type of comparator circuit equipped with a differential amplifier is shown in FIG. 4.

The differential amplifier 1 is composed of a pair of n-p-n transistors $Q_1$, $Q_2$ identical in properties and a first constant current source 2 connected to the emitters of both thereof.

The base of the aforementioned n-p-n transistor $Q_1$ has applied thereto a reference voltage Va for comparison. It is so arranged that this reference voltage Va is determined by the sum of the voltage across a resistor $R_1$ and the voltage across a second constant current source 3. The voltage across the aforementioned second constant current source 3 is kept constant and equal to the sum of another reference voltage $V_{ref}$ and the base-to-emitter voltage $V_{BE3}$ of an n-p-n transistor $Q_3$.

Meanwhile, the voltage across the resistor $R_1$ varies according to the current $I_3$ equal in amperage to the collector current $I_3$ which flows via a current mirror circuit 4.

That is, the reference voltage Va applied to the base of the n-p-n transistor $Q_1$ is varied according to the operating status of the differential amplifier 1 so that the comparator circuit has a hysteresis property.

An input terminal 5 is connected to the base of the n-p-n transistor $Q_2$ so that an input voltage VIN is applied thereto. The collector of the n-p-n transistor $Q_2$ is connected to the comparator's output terminal 6 via a p-n-p transistor $Q_6$ and an n-p-n transistor $Q_7$ so that an output voltage $V_{OUT}$ is obtained.

Hence, by the use of this comparator circuit, it is possible to obtain from the comparator's output terminal 6 an output voltage $V_{OUT}$ corresponding to the original pulse signal by applying the analog signal of the demodulated output from the photo detector element to the input terminal 5 as the input voltage $V_{IN}$.

Such a conventional comparator circuit, however, has a problem in that the input impedance of the input terminal is not sufficiently high.

That is, although the input impedance can be raised if the current $I_1$ is reduced, it is, however, impossible to sizably reduce the current $I_1$. For, if the current $I_1$ is reduced, a collector current $I_3$ of the n-p-n transistor $Q_1$ for setting the reference voltage Va is also reduced. Also, if the current $I_1$ is reduced, a collector current $I_4$ of the n-p-n transistor $Q_2$ to drive the n-p-n transistor $Q_7$ of the output circuit is reduced. Hence, actually, it is difficult to sizably raise the input impedance only by reducing the current amperage $I_1$ of the first constant current source 2.

SUMMARY OF THE INVENTION

It is a primary object of the present invention to provide a comparator circuit which enables the direct inputting of an input voltage, without the use a buffer or the like, by raising an input impedance to thereby simplify the circuit as a whole and widen the scope of application therefor.

Another object of the present invention is to provide a comparator circuit capable of preventing occurrence of impulses in the output pulses by precluding operation of the output circuit alone before any change of the threshold voltage has taken place for a hysteresis property to be imparted to the comparator circuit.

In order to accomplish the above objects, the present invention provides for obtaining a pulse output from the output terminal of a differential amplifier through a transistor in its output circuit by applying a threshold voltage to either input terminal of a differential amplifier composed of a pair of transistors and then comparing an input voltage applied to the other input terminal therewith, wherein the aforementioned pair of transistors of the differential amplifier are composed of two transistors connected in a complex manner, and the output terminal of the differential amplifier connected to the transistor in the aforementioned output circuit and the power source are connected through a resistor.

The complex-connected transistors constituting the aforementioned differential amplifier may be configured wherein the base of a p-n-p transistor and the collector of an n-p-n transistor, and the collector of the p-n-p transistor and the emitter of the n-p-n transistor are connected respectively.

The complex-connected transistors may also be configured wherein two transistors are darlington-connected.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 1 is circuit diagram showing a comparator circuit of the present invention;

FIG. 5 is a circuit diagram of a standard darlington configured transistor pair connectable in the circuit diagram of FIG. 1 in an alternate embodiment of the present invention.

DESCRIPTION OF THE EMBODIMENTS

Figure 2:
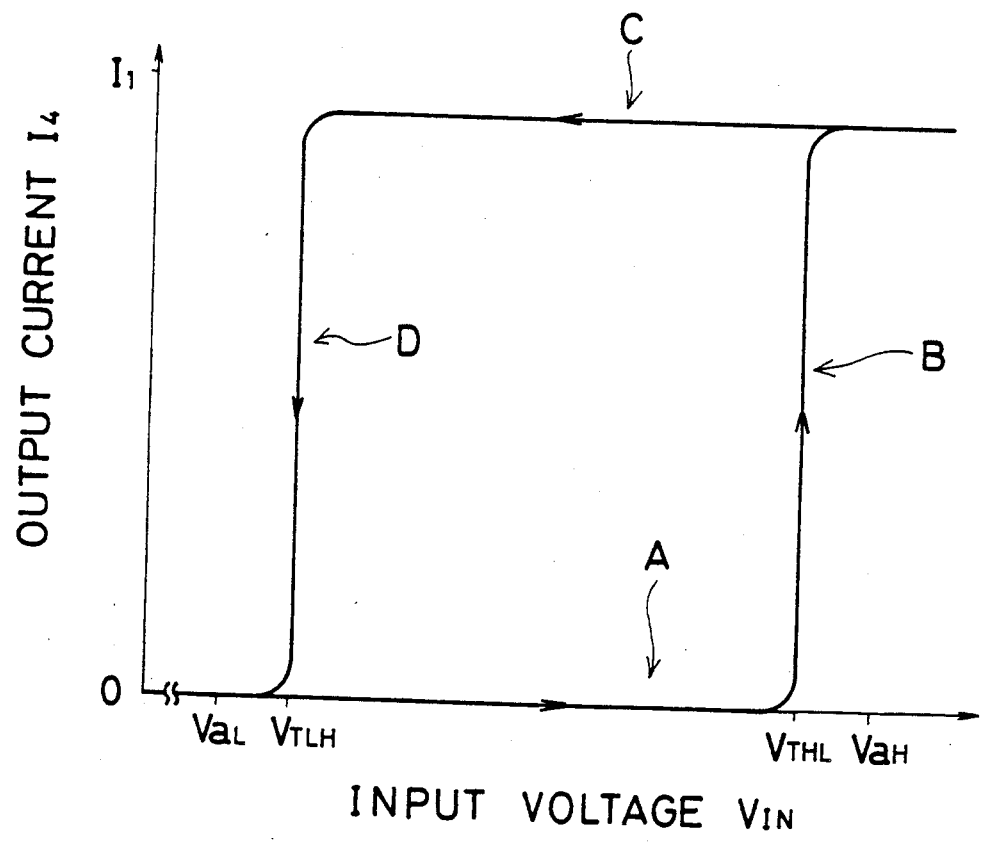
FIG. 2 is a graph showing the hysteresis property of the comparator circuit.

An embodiment of the present invention is described below with reference being made to FIGS. 1 through 3. In these figures, parts and components having like functions to those shown in the prior art described above are referred to by like symbols.

A differential amplifier 11 used in a comparator circuit is composed of a pair of transistors and the first constant current source 2.

A first pair of transistors constitute a p-n-p transistor $Q_{11}$ and an n-p-n transistor $Q_{12}$ complex-connected. That is, the collector of the n-p-n transistor $Q_{12}$ is directly connected with the base of the p-n-p transistor $Q_{11}$, while the emitter of the n-p-n transistor $Q_{12}$ is connected with the collector of the p-n-p transistor $Q_{11}$. When the p-n-p transistor $Q_{11}$ and the n-p-n transistor $Q_{12}$ are thus complex-connected, the resulting complex-connected circuit as a whole acts like a single n-p-n transistor.

The other pair of transistors constitute likewise a p-n-p transistor $Q_{21}$ and an n-p-n transistor $Q_{22}$ complex-connected. With the aforementioned each pair of transistors, the paired p-n-p transistors $Q_{11}$, $Q_{21}$ and n-p-n transistors $Q_{12}$, $Q_{22}$ are of similar properties respectively.

In the aforementioned pair of transistors, the emitters of the n-p-n transistors $Q_{12}$, $Q_{22}$ and the collectors of the p-n-p transistors $Q_{11}$, $Q_{21}$ are mutually connected, in common to the first constant current source 2.

The base of the n-p-n transistor $Q_{12}$ in one pair of transistors is connected to one end of the resistor $R_1$ and the collector of the p-n-p transistor $Q_4$. The other end of the aforementioned resistor $R_1$ is connected with the second constant current source 3 and the emitter of the n-p-n transistor $Q_3$. The collector of the n-p-n transistor $Q_3$ is connected to a power source Vcc, while its base is connected to a reference power source $V_{ref}$.

The aforementioned p-n-p transistor $Q_4$ constitutes a current mirror circuit 4 with the p-n-p transistor $Q_5$, and the emitters thereof are connected to the power source Vcc through resistors $R_2$, $R_3$ respectively. The common base of the current mirror circuit 4 and the collector of the p-n-p transistor $Q_5$ are connected to the emitter of the p-n-p transistor $Q_{11}$.

The base of the n-p-n transistor $Q_{22}$ of the other pair has the input terminal 5 connected thereto and the input voltage $V_{IN}$ can be applied thereto.

The emitter of the p-n-p transistor $Q_{21}$ of the other pair serves as the output terminal of the differential amplifier 11. The emitter of this p-n-p transistor $Q_{21}$ is connected to the base of the p-n-p transistor $Q_6$, which constitutes the output circuit, and also to the power source Vcc through a resistor for current supply $R_{11}$. This resistor for current supply $R_{11}$ is for directly supplying the output current from the power source Vcc to the emitter of the p-n-p transistor $Q_{21}$.

The p-n-p transistor $Q_6$ has its emitter connected to the power source Vcc, while its collector is grounded (GND) through resistors $R_4$, $R_5$ connected in series. The juncture between these resistors $R_4$ and $R_5$ is connected to the base of the n-p-n transistor $Q_7$.

The n-p-n transistor $Q_7$ has its collector connected to the power source Vcc through a resistor $R_6$ and its emitter grounded (GND). Between the collector of the n-p-n transistor $Q_7$ and the resistor $R_6$ there is connected the comparator's output terminal 6 for outputting the output voltage $V_{OUT}$.

Now, the mode of operation of the comparator circuit of the composition described above is explained, and first described are the individual pairs of transistors complex-connected in the differential amplifier 11.

As mentioned above, each pair of transistors is designed to act as a single n-p-n transistor. Assuming, therefore, that the current amplification factor of the p-n-p transistor $Q_{11}$ is $h_{fe}$ (pnp) and that of the n-p-n transistor $Q_{12}$ is $h_{fe}$ (npn), the current amplification factor $h_{fe}$(npn-pnp) for these transistors assumed as a single n-p-n transistor is represented by the following equation (1).

$$h_{fe}(npn-pnp) = h_{fe}(npn) \times [h_{fe}(pnp) - 1] \quad (1)$$

Figure 4:
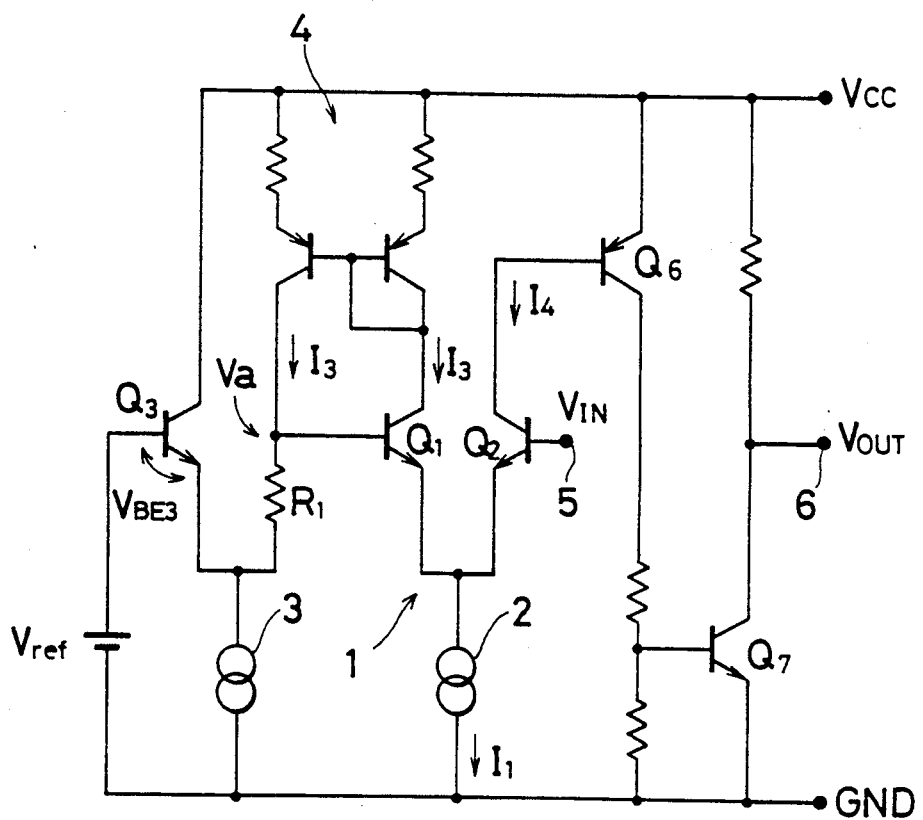
FIG. 4 is a circuit diagram showing a conventional comparator circuit.

That is, this pair of transistors is, compared with the conventional individual n-p-n transistor $Q_1$, $Q_2$ shown in FIG. 4, multiplied by $[h_{fe}(pnp) - 1]$ times in current amplification factor. This means that the input impedance of this pair of transistors is also $[h_{fe}(pnp) - 1]$ times higher than that of the conventional counterpart.

The same is true with other pair of transistors. Hence, this embodiment can provide a comparator circuit of a high input impedance with the input impedance of the differential amplifier 11 increased.

Since, however, the mode of operation of each pair of transistors itself can be deemed as that of a single n-p-n transistor, the comparator circuit of this embodiment acts in exactly the same manner as the conventional comparator circuit shown in FIG. 4, except that it is subject to the influence of the resistor for current supply $R_{11}$ connected to the emitter of the p-n-p transistor $Q_{21}$.

Then, the mode of operation of the comparator circuit except for that under the influence of the resistor for power supply $R_{11}$ is described below.

The reference voltage Va applied to the base of the n-p-n transistor $Q_{12}$ is as represented by the following equation (2), when the base-to-emitter voltage of the n-p-n transistor $Q_3$ is taken as $V_{BE3}$ and the current supplied from the current mirror circuit 4 as $I_3$.

$$Va = V_{ref} - V_{BE3} + R_1 \times I_3 \quad (2)$$

When the input voltage $V_{IN}$ applied to the input terminal 5 is lower than this reference voltage Va, the current $I_3$ becomes substantially equal in magnitude to the current $I_1$ of the first constant current source 2 due to the operation of the differential amplifier 11. Hence, the reference voltage $Va_H$ is represented by the following equation (3).

$$Va_H \approx V_{ref} - V_{BE3} + R_1 \times I_1 \quad (3)$$

When the input voltage $V_{IN}$ is higher than than the reference voltage Va, the output current $I_4$ flowing to the emitter of the p-n-p transistor $Q_{21}$ becomes to be substantially equal in magnitude to the current $I_1$ due to the operation of the differential amplifier 11 and the current $I_3$ almost ceases to flow. Hence, the reference voltage $Va_L$ is here represented by the following equation (4).

$$V_{AL} \approx V_{ref} - V_{BE3} \quad (4)$$

Thus, the reference voltage Va shifts between the high-level reference voltage $Va_H$ and the low-level reference voltage $Va_L$ according to the output status of the differential amplifier 11.

The hysteresis property of the output current $I_4$ versus the input voltage $V_{IN}$ in the differential amplifier 11 is described below with reference being made to FIG. 2.

First, in the state of the output current $I_4$ scarcely flowing, the p-n-p transistor $Q_6$ and the n-p-n transistor $Q_7$ are both made OFF, hence the output voltage $V_{OUT}$ of the comparator's output terminal 6 goes to the high-level equal to the voltage level of the power source Vcc.

Figure 3:
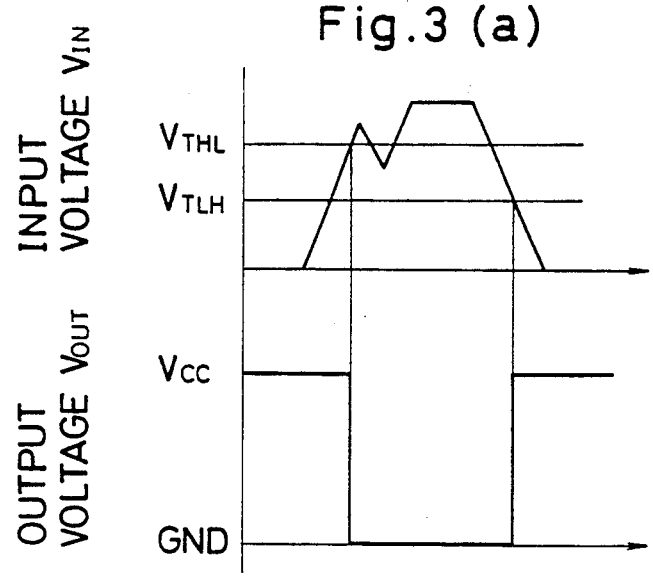
FIG. 3(a) is a time chart showing a normal hysteresis behavior.
FIG. 3(b) is a time chart showing an erroneous operation which may occur when a resistor for current supply is not connected to the output terminal of a differential amplifier.
FIG. 3(c) is a time chart showing the operation when a resistor for power supply is connected to the output terminal of the differential amplifier for preventing erroneous operation.
Figure 3:
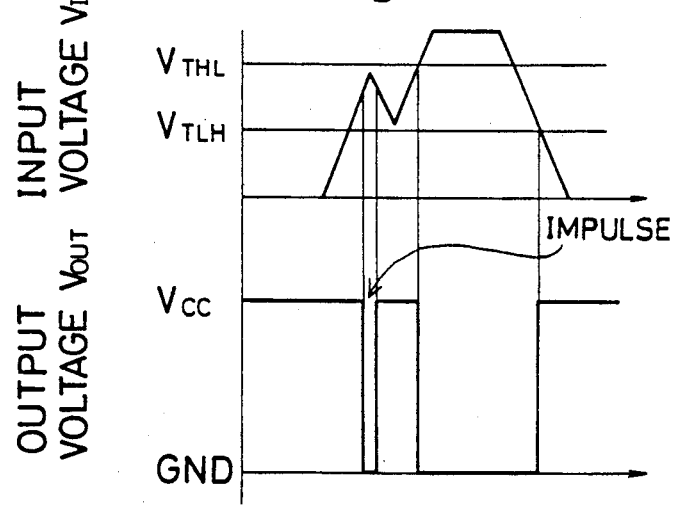
Figure 3:
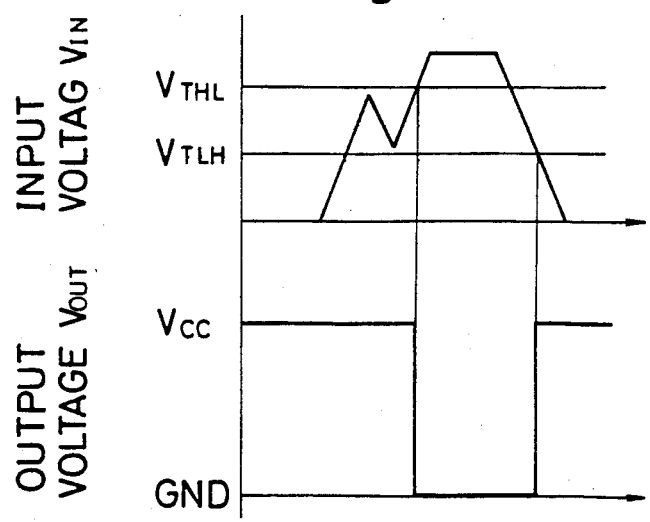

When, in this state, the input voltage $V_{IN}$ is raised, the output current $I_4$ remains scarcely flowing while the input voltage $V_{IN}$ remains in a low range (See A in FIG. 2). Then, as the input voltage $V_{IN}$ approaches the high-level reference voltage $Va_H$, the output current $I_4$ starts increasing gradually due to the so-called linear behavior of the differential amplifier 11.

As the input voltage $V_{IN}$ is further raised, when it has reached the high-level threshold voltage $V_{THL}$ a little below the reference voltage $Va_H$, this reference voltage $Va_H$ is changed to the low-level reference voltage $Va_L$ with simultaneous sudden increase of the output current $I_4$ (See B in FIG. 2). The output current $I_4$ is saturated when it has become substantially equal in magnitude to the current $I_1$ of the first constant current source 2.

In this state, the p-n-p transistor $Q_6$ and n-p-n transistor $Q_7$ both switch ON and the output voltage $V_{OUT}$ comes down to the low level equal to the voltage level of GND (grounding).

Then, from this state the input voltage $V_{IN}$ is lowered (See C in FIG. 2). As this input voltage $V_{IN}$ approaches the low-level reference voltage $Va_L$, the current $I_3$ flowing to the emitter of the p-n-p transistor $Q_{11}$ starts increasing gradually in magnitude due to the linear behavior of the differential amplifier 11 and the output current $I_4$ decreases gradually and accordingly. As the input voltage $V_{IN}$ is lowered further still, this reference voltage $Va_L$ changes to the high-level reference voltage $Va_H$ when the input voltage $V_{IN}$ has reached the low-level threshold voltage $V_{TLH}$ a little above the reference voltage $Va_L$, and the output current $I_4$ is decreased simultaneously and suddenly in magnitude (See D in FIG. 2.). The output current $I_4$ is decreased to the zero-level.

In this status, the p-n-p transistor $Q_6$ and n-p-n transistor $Q_7$ of the output circuit are both OFF with the output voltage $V_{OUT}$ restored to the high-level equal to the voltage level of the power source Vcc.

This hysteresis property is shown in FIG. 3(a) in terms of relationship between the input and output voltages $V_{IN}$ and $V_{OUT}$.

First, when the input voltage $V_{IN}$ is low, the output voltage $V_{OUT}$ is at the high-level equal to the voltage level of the power source Vcc. When the input voltage $V_{IN}$ increases to be in excess of the high-level threshold voltage $V_{THL}$, the output voltage $V_{OUT}$ turns down to the low GND level. Then, even if the input voltage $V_{IN}$ should somewhat drop below the high-level threshold voltage $V_{THL}$, the output voltage $V_{OUT}$ is kept in the low range unless the input voltage $V_{IN}$ should drop below the low-level threshold voltage $V_{TLH}$. When the input voltage $V_{IN}$ continues lowering to be below the low-level threshold voltage $V_{TLH}$, the output voltage $V_{OUT}$ turns up to be restored to the high level equal to the voltage level of the power source Vcc.

This hysteresis property prevents the output voltage $V_{OUT}$ from being affected by the delicate fluctuation of the input voltage $V_{IN}$ in the vicinity of the threshold voltage $V_T$.

Now, the mode of operation enabled by the use of the resistor for current supply $R_{11}$ is described.

When the resistor for current supply $R_{11}$ is not connected between the emitter of the p-n-p transistor $Q_{21}$ and the power source Vcc and these are left "open", impulses are caused in the pulses of the output voltage $V_{OUT}$.

That is, as the input voltage $V_{IN}$ rises to approach the high-level threshold voltage $V_{THL}$, the output current $I_4$ starts flowing gradually due to the linear behavior, within a narrow range in the vicinity of the high-level threshold voltage $V_{THL}$. When the resistor for current supply $R_{11}$ is not utilized, however, this output current $I_4$ is supplied from the base of the p-n-p transistor $Q_6$.

Therefore, the p-n-p transistor $Q_6$ and the n-p-n transistor $Q_7$ are both made active before the high level reference voltage $Va_H$, that is, the threshold voltage $V_{THL}$ is changed, the output voltage $V_{OUT}$ turns to the low level and resultant malfunction of the output circuit is caused. If, in this state, the input voltage $V_{IN}$ should begin turning down without exceeding the threshold voltage $V_{THL}$, the output voltage $V_{OUT}$ immediately switches and is restored to the high-level.

Such malfunction of the output circuit can occur also when the input voltage $V_{IN}$, is having once exceeded the high-level threshold voltage $V_{THL}$, is again turned down to be in the vicinity of the low-level threshold voltage $V_{TLH}$. Moreover, when, as in this embodiment, the differential amplifier 11 is composed of complex-connected pairs of transistors, the current amplification factor is increased, and the possibility of occurrence of such malfunctions can be quite high. In such cases, impulses are bound to take place in the pulses of the output voltage $V_{OUT}$ each time the input voltage $V_{IN}$ undergoes changes as described above.

In the comparator circuit of this embodiment, however, the emitter of the p-n-p transistor $Q_{21}$ and the power source Vcc are connected via the resistor for current supply $R_{11}$, hence, as is apparent from FIG. 3(c), there is no risk of impulses occurring in the pulses of the output voltage $V_{OUT}$. That is, even if the input voltage $V_{IN}$ should rise to be in the vicinity of the high-level threshold voltage $V_{THL}$, the output current $I_4$, having started flowing gradually, can be supplied through this resistor $R_{11}$.

Hence, until the input voltage $V_{IN}$ has exceeded the high-level threshold voltage $V_{THL}$ and this threshold voltage $V_{THL}$ has changed to the low-level counterpart $V_{TLH}$, there is no risk of the p-n-p transistor $Q_6$ being made active. Malfunction of the output circuit can, therefore, be prevented without fail even if the input voltage $V_{IN}$ should undergo a change similar to what is shown in FIG. 3(b) and there is no risk of impulses occurring in the pulses of the output voltage $V_{OUT}$ as shown in FIG. 3(c).

It is noted that between the threshold voltage applied to either input terminal of the differential amplifier and the threshold voltage at which the differential amplifier responds there actually exists some difference.

As described above in detail, the present invention is for obtaining a pulse output from the output terminal of a differential amplifier through a transistor in its output circuit by applying a threshold voltage to either input terminal of a differential amplifier composed of a pair of transistors and then comparing an input voltage applied to the other input terminal therewith, wherein the aforementioned pair of transistors of the differential amplifier are composed of each two transistors connected in a complex manner, and the output terminal of the differential amplifier connected to the transistor in the aforementioned output circuit and the power source are connected through a resistor.

The complex-connected transistors may also be configured wherein two transistors are darlington-connected. A standard darlington configured transistor pair is shown in FIG. 5 with the corresponding leads a, b, and c connectable in the circuit of FIG. 1 as shown. Two sets of the darlington configured transistor pairs would be connectable in the circuit of FIG. 1 for transistors $Q_{11}$, $Q_{12}$ and $Q_{21}$, $Q_{22}$.

By any of the methods described above it is possible to obtain a comparator circuit which enables direct input of an input voltage, without the use of a buffer or the like to thereby simplify the circuit as a whole and to widen its scope of application, and to furthermore prevent occurrence of impulses in the output pulses by ensuring against operation of the output circuit alone before change of the threshold voltage has taken place for a hysteresis property to be imparted to the comparator circuit.

What is claimed is:

1. A comparator circuit comprising:
   differential amplifier means including
      a first complex-connected transistor pair including a first n-p-n transistor with an emitter coupled to a first current source, a base coupled to a comparator reference voltage, and a collector and a first p-n-p transistor with an emitter, a base coupled to the collector of said first n-p-n transistor, and a collector coupled to said first current source, and
      a second complex-connected transistor pair including a second n-p-n transistor with an emitter coupled to said first current source, a base coupled to a comparator circuit input, and a collector and a second p-n-p transistor with an emitter, a base coupled to said collector of said second n-p-n transistor, and a collector coupled to said first current source;
   current mirror means, coupled to said base of said first n-p-n transistor, said emitter of said first p-n-p transistor, and to a system power source, for varying said comparator reference voltage so that the comparator circuit has a hysteresis property;
   output means, coupled to said emitter of said second p-n-p transistor, said system power source, and system ground, for outputting output pulses as the comparator circuit output; and
   a current supply resistor, coupled to said emitter of said second p-n-p transistor, said output means, and said system power source, for preventing the occurrence of noise impulses in the output pulses of the comparator circuit by preventing operation of said output means before a change in said hysteresis property of said differential amplifier means has occurred.

2. The comparator circuit of claim 1 in which said current mirror means comprises:
   a third p-n-p transistor with an emitter coupled to said system power source, a base coupled to said emitter of said first p-n-p transistor, and a collector coupled to said base of said first n-p-n transistor; and
   a fourth p-n-p transistor with an emitter coupled to said system power source, a base coupled to said emitter of said first p-n-p transistor, and a collector coupled to said emitter of said first p-n-p transistor.

3. The comparator circuit of claim 2 in which said output means comprises:
   a fifth p-n-p transistor with an emitter coupled to said system power source, a base coupled to said current supply resistor and said emitter of said second p-n-p transistor, and a collector; and
   a third n-p-n transistor with a collector for providing said output pulses, a base coupled to said collector of said fifth p-n-p transistor through a first resistor and coupled to said system ground through a second resistor, and an emitter coupled to said system ground.

4. The comparator circuit of claim 1 wherein said current mirror means provides said hysteresis at an input side of said comparator circuit and said current supply resistor does not affect said hysteresis property.

5. A comparator circuit comprising:
   differential amplifier means including
      a first complex-connected transistor pair including a first n-p-n transistor with an emitter, a base coupled to a comparator reference voltage, and a collector and a second n-p-n transistor with a collector coupled to said collector of said first n-p-n transistor, a base coupled to the emitter of said first n-p-n transistor, and an emitter coupled to a first current source, and
      a second complex-connected transistor pair including a third n-p-n transistor with an emitter, a base coupled to a comparator circuit input, and a collector and a fourth n-p-n transistor with a collector coupled to said collector of said third n-p-n transistor, a base coupled to said emitter of said third n-p-n transistor, and an emitter coupled to said first current source;
   current mirror means, coupled to said base of said first n-p-n transistor, said collectors of said first and second n-p-n transistors, and to a system power source, for varying said comparator reference voltage so that the comparator circuit has a hysteresis property;
   output means, coupled to said collectors of said third and fourth n-p-n transistors, said system power source, and system ground, for outputting output pulses as the comparator circuit output; and
   means for preventing the occurrence of noise impulses in the output pulses of the comparator circuit by preventing operation of said output means before a change in said hysteresis property of said differential amplifier means has occurred, said means for preventing consisting essentially of a current supply resistor, coupled to said collectors of said third and fourth n-p-n transistors, said output means, and said system power source.

6. The comparator circuit of claim 5 in which said current mirror means comprises:
   a first p-n-p transistor with an emitter coupled to said system power source, a base coupled to said collectors of said first and second n-p-n transistors, and a collector coupled to said base of said first n-p-n transistor; and
   a second p-n-p transistor with an emitter coupled to said system power source, a base coupled to said collectors of said first and second n-p-n transistors, and a collector coupled to said collectors of said first and second n-p-n transistors.

7. The comparator circuit of claim 6 in which said output means comprises:
   a third p-n-p transistor with an emitter coupled to said system power source, a base coupled to said current supply resistor and said collectors of said third and fourth n-p-n transistors, and a collector; and
   a fifth n-p-n transistor with a collector for providing said output pulses, a base coupled to said collector of said third p-n-p transistor through a first resistor and coupled to said system ground through a second resistor, and an emitter coupled to said system ground.

8. A comparator circuit comprising:
   differential amplifier means including a first transistor pair of a first and a second transistor and a second transistor pair of a third and a fourth transistor, said first and third transistors and said second and fourth transistors respectively of identical properties;
   current mirror means, coupled to a system power source and said differential amplifier means, for varying a comparator reference voltage of said differential amplifier means so that the comparator circuit has a hysteresis property;
   output means, coupled to said differential amplifier means, said system power source, and system ground, for outputting output pulses as the comparator circuit output; and
   means for preventing the occurrence of noise impulses in the output pulses of the comparator circuit by preventing operation of said output means before a change in said hysteresis property of said differential amplifier means has occurred, said means for preventing consisting essentially of a current supply resistor, coupled to said output means and coupled between said system power source and said differential amplifier means.

* * * * *